US011611001B2

(12) United States Patent
Clark et al.

(10) Patent No.: US 11,611,001 B2
(45) Date of Patent: Mar. 21, 2023

(54) LOCALIZED STRAIN FIELDS IN EPITAXIAL LAYER OVER CREO (71) Applicant: IQE plc, Cardiff (GB)

(72) Inventors: Andrew Clark, Mountain View, CA (US); Rodney Pelzel, Bethlehem, PA (US); Richard Hammond, Newport (GB)

(73) Assignee: IQE plc, Cardiff (GB)

( * ) Notice: Subject to any disclaimer, the term of this patent is extended or adjusted under 35 U.S.C. 154(b) by 29 days.

(21) Appl. No.: 17/229,992

(22) Filed: Apr. 14, 2021

(65) Prior Publication Data
US 2021/0320214 A1    Oct. 14, 2021

Related U.S. Application Data (60) Provisional application No. 63/009,890, filed on Apr. 14, 2020.

(51) Int. Cl.
*H01L 21/00*    (2006.01)
*H01L 29/84*    (2006.01)
*H01L 21/02*    (2006.01)
*H01L 21/62*    (2006.01)

(52) U.S. Cl.
CPC ........ *H01L 29/84* (2013.01); *H01L 21/02532* (2013.01); *H01L 21/02565* (2013.01); *H01L 21/62* (2013.01)

(58) Field of Classification Search
CPC ............... H01L 29/84; H01L 21/02532; H01L 21/02565; H01L 21/62
See application file for complete search history.

(56) References Cited

U.S. PATENT DOCUMENTS

| 2013/0214879 A1 | 8/2013 | Gorisse et al. |
| 2019/0036007 A1 | 1/2019 | Kononchuk et al. |
| 2019/0074365 A1 | 3/2019 | Pelzel et al. |

(Continued)

FOREIGN PATENT DOCUMENTS

FR    3063854 A1    9/2018

OTHER PUBLICATIONS

Extended European Search Report and Written Opinion for European Application No. 21167114.4, European Patent Office, Munich, dated Sep. 13, 2021, 10 pages.

*Primary Examiner* — Richard A Booth
(74) *Attorney, Agent, or Firm* — Sterne, Kessler, Goldstein & Fox P.L.L.C.

(57) ABSTRACT

A layered structure (100) for transmission of an acoustic wave, the layered structure (100) comprising: a substrate layer (102); and a second layer (104) over the substrate layer (102), wherein the second layer (104) comprises a plurality of discrete portions (105) adjacent to each other, each discrete portion (105) of the plurality of discrete portions (105) comprising a first subregion (104A) and a second subregion (104B). Also an epitaxial layer (108), grown over the second layer (104), for transmission of the acoustic wave in a major plane of the epitaxial layer (108), wherein a periodicity (λ) of a wavelength of the acoustic wave to be transmitted through the epitaxial layer (108) is approximately equal to a sum of a width ($d_A$) of the first subregion (104A) and a width ($d_B$) of the second subregion (104B).

17 Claims, 8 Drawing Sheets (56) References Cited

U.S. PATENT DOCUMENTS

| | | | |
|---|---|---|---|
| 2019/0165252 A1 | 5/2019 | Broekaart | |
| 2019/0227233 A1* | 7/2019 | Clark | H01S 5/026 |
| 2020/0389148 A1 | 12/2020 | Vo et al. | |
| 2022/0189994 A1* | 6/2022 | Augendre | H01L 21/763 |

* cited by examiner

LOCALIZED STRAIN FIELDS IN EPITAXIAL LAYER OVER CREO

INTRODUCTION

This application relates to semiconductor designs, and more specifically, to a layered structure for transmission of an acoustic wave through a locally stressed epitaxial layer, in which a second layer, sandwiched between the substrate and the epitaxial layer includes discrete regions that locally stress the epitaxial layer and improve the transmission of the acoustic wave through the epitaxial layer.

BACKGROUND

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of any epitaxial layer. The epitaxial layer can be, in some examples, lattice-matched or lattice-coincident. A lattice matched crystalline layer can have the same or a very similar lattice spacing as the top surface of the crystalline substrate. A lattice-coincident crystalline layer can have a lattice spacing that is an integer multiple of the lattice spacing of the crystalline substrate. The quality of the epitaxy is based in part on the degree of crystallinity of the crystalline layer. Practically, a high-quality epitaxial layer will be a single crystal with minimal defects and few or no grain boundaries. Traditionally, metal contact layers are applied to an epitaxial structure at some point in the downstream processing. With complex epitaxial structures often incorporating more than one device functionality, this can require extensive etching and deposition of metals on wafers with a large amount of topography.

Interactions between a substrate layer and an epitaxial layer are often critical to device operation. One example of such an interaction between a substrate and an epitaxial layer (e.g., a semiconductor layer) occurs in a thin-film resonator such as an RF filter where the overall acoustic performance is defined by the product of the acoustic impedance of the electrode and the acoustic impedance of the piezoelectric material. In fact, to access high-resonant frequencies it is essential to make both the electrode and the piezoelectric material thin.

SUMMARY

In some cases, acoustic Bragg reflectors (ABR) are used to surround a resonant cavity to form resonators. Such resonators can improve efficiency but are much more complicated to manufacture. In the present invention, a second layer sandwiched between a substrate layer and an epitaxial layer can locally stress the epitaxial layer. By providing a layer that can locally stress the subsequent-grown layer, improved epitaxially-grown devices can be made. The second layer can include a plurality of discrete regions formed over the substrate layer. Each of the discrete regions is adjacent to another discrete region. Each discrete region includes at least two different materials, for example, each discrete region can include two of the following material, cREO, non-porous silicon, porous silicon, and fully-depleted porous silicon. These discrete regions produce a localized stress that may be used to manipulate in-plane characteristics of the epitaxial layer that is formed over the second layer that has the discrete regions.

For example, a discrete region can include a first subregion and a second subregion. The discrete regions can include a crystalline rare earth oxide and a second material (e.g., non-porous silicon, porous silicon, silicon oxide ($SiO_2$), etc.). Such discrete regions in the second layer can improve epitaxial growth of additional materials over the patterned template wafer.

Epitaxial growth of layers in a layered structure over semiconductor layers is disclosed in U.S. Pat. No. 10,573,686, the contents of which is incorporated herein by reference in its entirety.

The second layer, by utilizing a cREO in the first subregion of the discrete regions, can control the stress imparted on the subsequent-grown layers. The thickness of the cREO controls the stress imparted on the epitaxial layer grown over the second layer containing the regions of cREO. These discrete regions not only facilitate further epitaxial growth of additional materials, but also function as acoustic Bragg reflectors (ABS) by reflecting acoustic waves transmitting through the epitaxial layer, similarly to, for example, a surface acoustic wave (SAW) filter. A SAW filter includes coupled electro-mechanical resonators that convert electrical signals into acoustic waves of desired resonant frequencies. The resonant frequencies are chosen to give a desired bandpass frequency. The combined width of the first subregion and the second subregion in one discrete region may be defined as the periodicity ($\lambda$) of the second layer, and is chosen with a predetermined relationship to a wavelength of the acoustic wave to be transmitted. In addition, the individual acoustic impedances of the materials in the subregions of the discrete region are taken into account in determining the periodicity of the second layer, as well as the relative widths of the subregions within the periodicity. The discrete region acts an acoustic Bragg reflector and by having spacing defined by the periodicity of the wavelength, the discrete region imparts improved efficiency of the transmission of the acoustic wave on the epitaxial layer. That is, as the acoustic wave travels through the epitaxial layer, the discrete region reflects the wavelength and prevents it from exiting the epitaxial layer.

The layer structure may be included in a radio-frequency (RF) filter. The epitaxial layer (e.g., a semiconductor layer) grown over the second layer may be a piezoelectric material that acts as a coupled electro-mechanical resonator. The epitaxial layer may be a first electrode for the RF filter. Epitaxial layers are particularly useful for electrodes in RF filters because they provide the high-conductivity of metal with single-crystal structures that serve as templates for the subsequent growth of single-crystal layers (e.g., the semiconductor layer) over the metal layers. Single-crystal semiconductor layers are useful as the semiconductor material in RF filters because they provide higher piezoelectric coefficients, narrower bandwidths, and lower losses.

That is, the layered structure, by utilizing a second layer with discrete regions defined by the periodicity ($\lambda$) of the second layer, and chosen with a predetermined relationship to a wavelength of the acoustic wave to be transmitted, can support improved epitaxial growth of additional materials over the patterned template wafer, which results in higher quality of subsequent films.

A layered structure for transmission of an acoustic wave, the layered structure comprising: a substrate layer; a second layer over the substrate layer, wherein the second layer comprises a plurality of discrete portions adjacent to each other, each discrete portion of the plurality of discrete portions comprising a first subregion and a second subregion; and an epitaxial layer, grown over the second layer, for transmission of the acoustic wave in a major plane of the epitaxial layer, wherein a periodicity (λ) of a wavelength of the acoustic wave to be transmitted through the epitaxial layer is approximately equal to a sum of a width of the first subregion and a width of the second subregion.

Advantageously the discrete portions apply localized stress to the epitaxial layer which improves the acoustic transmission.

The first subregion may be selected from the group comprising non-porous silicon, porous silicon, crystalline rare earth oxides (cREO), and combinations thereof and wherein the second subregion may be selected from the group comprising non-porous silicon, porous silicon, crystalline rare earth oxides (cREO), and combinations thereof.

The epitaxial layer may be one of a semiconductor layer, a RE-III-N layer, an epitaxial metal layer, a crystalline rare earth oxide (cREO) layer, and a silicon layer.

The substrate may include one or more group IV elements selected from the group comprising silicon (Si), germanium (Ge), silicon-on-insulator (SOI), and SiGe.

The layered structure may further comprise electrodes (112) disposed over the epitaxial layer (108), wherein the electrodes (112) are distributed based on the periodicity (λ) of the second layer (104).

A method of forming a layered structure for transmission of an acoustic wave, the method comprising: providing a substrate layer; etching a surface of the substrate layer to form a second layer over the substrate layer, the second layer comprising a plurality of discrete portions adjacent to each other, each discrete portion of the plurality of discrete portions comprising a first subregion and a second subregion, wherein the first subregion forms a void; depositing a material into the void of the first subregion of the second layer, to form localized stress in the second layer; and growing an epitaxial layer over the second layer, for transmission of the acoustic wave, wherein, when an acoustic wave is to be transmitted through the epitaxial layer, a periodicity (λ) of a wavelength of the acoustic wave is matched to a sum of a width of the first subregion and a width of the second subregion.

Advantageously the discrete portions apply localized stress to the epitaxial layer which improves the acoustic transmission.

The method may further comprise: processing the second subregion of the second layer with anodic etching to make the second subregion porous.

Growing the epitaxial material into the first subregion of the second layer may comprise growing a material selected from the group comprising non-porous silicon, porous silicon, crystalline rare earth oxides (cREO), and combinations thereof.

Growing the epitaxial layer over the second layer may comprise growing one of a semiconductor layer, a RE-III-N layer, an epitaxial metal layer, a crystalline rare earth oxide (cREO) layer, and a silicon layer.

A method of forming a layered structure for transmission of an acoustic wave, the method comprising: providing a substrate layer; depositing a second layer over the substrate layer, the second layer comprising a plurality of discrete second subregions adjacent to each other with voids between them; depositing a material into the voids to form first subregions of the second layer, to provide localized stress in the second layer; and growing an epitaxial layer over the second layer, for transmission of the acoustic wave, wherein, when an acoustic wave is to be transmitted through the epitaxial layer, a periodicity (λ) of a wavelength of the acoustic wave is matched to a sum of a width of the first subregion and a width of the second subregion.

Advantageously the discrete portions apply localized stress to the epitaxial layer which improves the acoustic transmission.

The method may further comprise processing the first subregion of the second layer with anodic etching to make the first subregion porous.

The method may further comprise processing the second subregion of the second layer with anodic etching to make the second subregion porous.

Growing the epitaxial material into the voids of the second layer may comprise growing a material selected from the group comprising non-porous silicon, porous silicon, crystalline rare earth oxides (cREO), and combinations thereof.

Growing the epitaxial layer over the second layer may comprise growing one of a semiconductor layer, a RE-III-N layer, an epitaxial metal layer, a crystalline rare earth oxide (cREO) layer, and a silicon layer.

BRIEF DESCRIPTION OF THE DRAWINGS

Further features of the disclosure, its nature and various advantages will be apparent upon consideration of the following detailed description, taken in conjunction with the accompanying drawings, in which.

DETAILED DESCRIPTION

Structures and methods described herein provide a layered structure including a substrate layer, a second layer over the substrate and an epitaxial layer over the second layer. The second layer is integrated between the substrate layer and the epitaxial layer, and incorporates discrete regions to impart localized stress within an epitaxial layer that transmits an acoustic wave.

Figure 1:
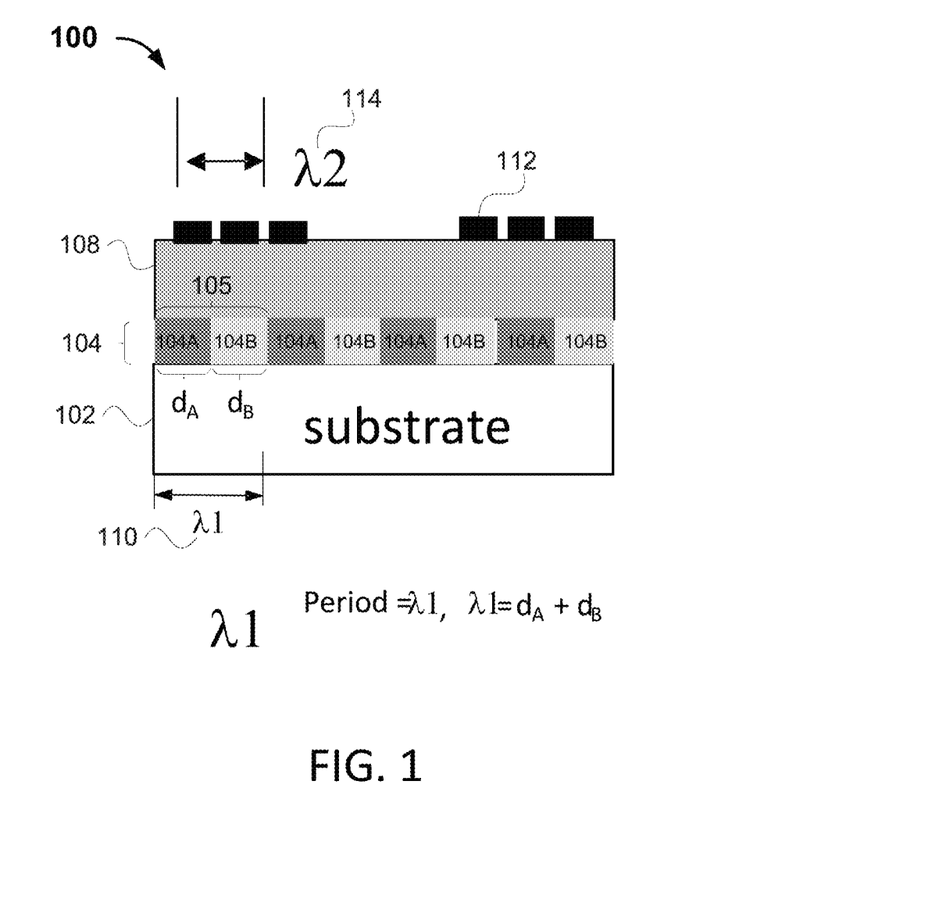
FIG. 1 shows a cross-sectional view of an illustrative layered structure with a second layer between a substrate and a semiconductor layer, defined by a periodicity (λ) and chosen with a predetermined relationship to an acoustic wavelength, according to an illustrative implementation.

FIG. 1 shows a cross-sectional view of an illustrative layered structure with a second layer between a substrate and a semiconductor layer, matched to a periodicity of an acoustic wavelength, according to an illustrative embodiment. Layered structure 100 may be used as an RF filter. Layered structure 100 includes a substrate 102, a second layer 104 over the substrate layer 102, an epitaxial layer 108 grown over the second layer, and electrodes 112 disposed over the top of the epitaxial layer. The second layer 104 includes discrete regions 105. Each discrete region 105 includes a first subregion 104A and a second subregion 104B.

The substrate layer 102 may be of single crystal, and can be doped or undoped and have any crystal orientation including <111>, <110>, or <100>, either on-axis or off-axis. For example, substrate 102 can include one or more group IV elements selected from the group consisting of silicon (Si), germanium (Ge), silicon-on-insulator (SOI), and SiGe. The substrate layer 102 may be monolithic.

The second layer 104 includes discrete regions 105. Each discrete region 105 includes a first subregion 104A and a second subregion 104B. The discrete region repeats throughout the second layer, with each discrete region adjacent to another discrete region. The multiple discrete regions may have different densities and may be horizontally distributed. In one embodiment, the second subregion 104B of the discrete region 105 can include periodic variation of porosity through the depth of the second subregion. In such a case, the porosity of the second subregion can be graded, and gradually increase. The first subregion and the second subregion of each discrete region of the second layer may be grown or deposited over the substrate 102, over which the epitaxial layer may be grown or deposited. The material for the first layer may be selected from non-porous silicon, porous silicon, crystalline rare earth oxides (cREO), and combinations thereof. A transition layer, (not shown), (e.g., in the form of a continuous sublayer of the substrate 102), may be located between substrate 102 and any other layer grown or deposited over the substrate 102, to transition the material of substrate 102 to the material of the second layer (a second layer 104 including two materials in this example). The transition layer may have a thickness of 5-10 nm.

Alternatively, there may be no transition layer between substrate 102 and the second layer 104. Each discrete region of the second layer can include regions of cREO and non-porous silicon, cREO and porous silicon, or porous silicon and non-porous silicon. In such an example, the first subregion and the second subregion of each discrete region of the second layer 104 are grown or deposited directly over the substrate 102.

The discrete regions 105 may have a non-continuous pattern, e.g., with a first subregion 104A and a second subregion 104B that do not overlap with each other. The first subregion 104A and the second subregion 104B of the discrete region 105 of the second layer may take a form similar to grids, rows, columns, dots, rings, or other irregular shapes. The discrete regions 105 provide a localized stress to the subsequent epitaxial layers grown or deposited over the second layer 104.

In some embodiments, the widths of the discrete regions—i.e., the sum of width $d_A$ of the first subregion 104A and width $d_B$ of the second subregion 104B, may be defined as a periodicity λ that is related to a wavelength of an acoustic wave to be transmitted through the epitaxial layer. For example, the width of the first subregion and the second subregion may be varied to create a periodicity λ that results in the most efficient transmission of acoustic waves through the epitaxial layer.

The epitaxial layer 108 may be in direct contact with the second layer 104. The epitaxial layer 108 may be any III-N material that exhibits a piezoelectric response, where the III-N material includes alloys of Al, In, and Ga or any combination of these elements. In some embodiments, the epitaxial layer may be a semiconductor layer, a RE-III-N layer, an epitaxial metal layer, a crystalline rare earth oxide (cREO) layer, or a silicon layer. In some embodiments, the epitaxial layer includes a doped III-N alloy, or a RE-III-N alloy ($III_xRE_{1-x}N$), where the rare earth (RE) elements include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) and yttrium (Y).

The thickness of the epitaxial layer 108 can be selected based on Equation 1 below, which defines the relationship between frequency, sound velocity through the epitaxial layer, and thickness.

$$f_A = v_S/(2*t_f)$$

where $f_A$ is the frequency, vs is the velocity of sound through the piezoelectric layer, and $t_f$ is the piezoelectric layer thickness.

Electrodes 112 disposed over the epitaxial layer 108 are distributed based on the periodicity of layer 104. For example, where the periodicity is one period of the acoustic wave, the electrodes may be spaced such that two electrodes fall within one period (e.g., periodicity λ2=2*λ1) of layer 104. The periodicity λ for the layer can be varied based on the wavelength of the acoustic wave which is set by the periodicity λ2 of the electrodes. The periodicity λ of the second layer 104 can be a multiple of the periodicity λ2 of the electrodes. The multiple of the periodicity λ of the second layer can be in a range from 0.5 to 2 of the periodicity λ2 of the electrode. For example, the periodicity λ of the second layer can be approximately equal to the periodicity λ of the electrode, (periodicity λ=periodicity λ2). In another example, the periodicity λ of the second layer can be a multiple of 2 of periodicity λ2 of the electrode, (periodicity λ=2*periodicity λ2).

Figure 2:
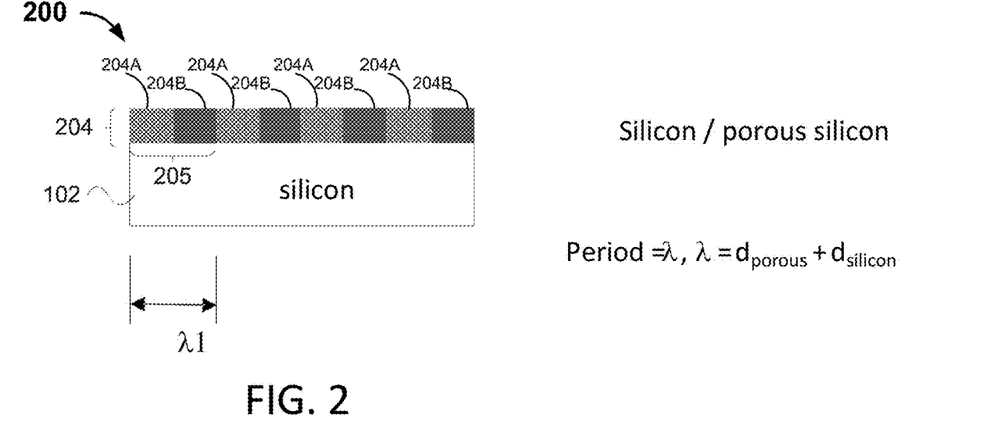
FIGS. 2-4 show examples of a layered structure with various second layers, according to an illustrative implementation.
Figure 3:
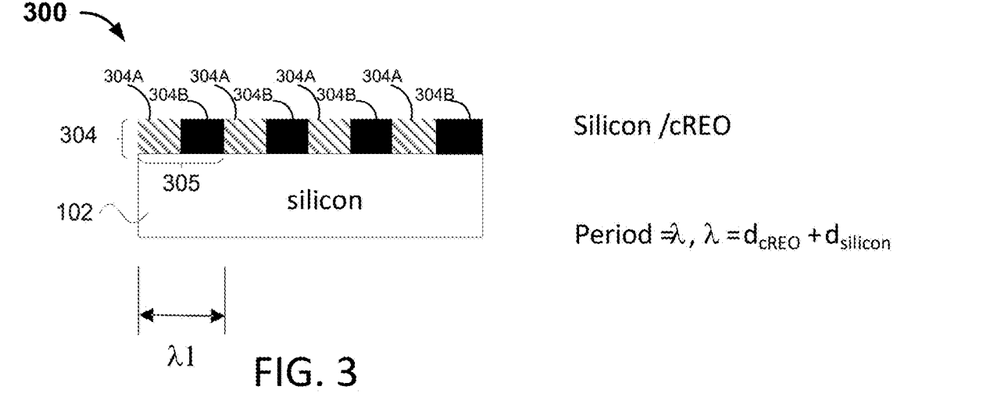
Figure 4:
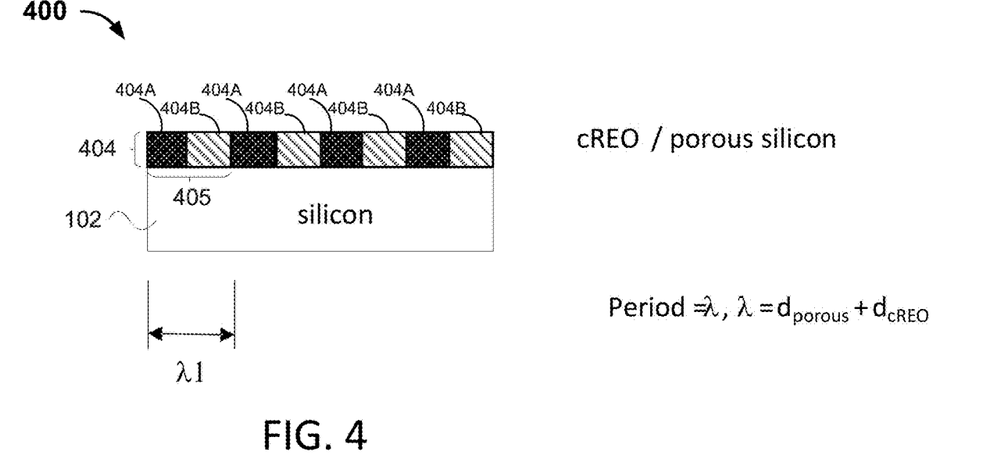

FIGS. 2-4 show examples of a layered structure with various second layers, according to illustrative embodiments. It should be noted that layered structure 200, 300, or 400 or any feature of layered structure 200, 300, or 400 could be provided in any of the devices shown in FIGS. 1 and 5-9. For example, second layer 204 may be implemented in a layered structure 100 (FIG. 1).

In the example shown in FIG. 2, the second layer 204 includes a discrete region 205. The discrete region 205 may include a first subregion 204A and a second subregion 204B. The first subregion 204A can be non-porous silicon. The second subregion 204B can be porous silicon. In some embodiments, the sum of a width of first subregion 204A of non-porous silicon and a width of second subregion 204B of porous silicon may be defined as a periodicity related to a wavelength of an acoustic wave expected to travel through the epitaxial layer. According to such a combination of a first subregion and a second subregion, the second layer can facilitate localized strain on the additional layer grown or deposited. Such localized strain can improve the epitaxial growth of additional layers.

In the example shown in FIG. 3, the second layer 304 includes a discrete region 305. The discrete region 305 may include a first subregion 304A and a second subregion 304B. The first subregion 304A can be crystalline rare earth oxide. The second subregion 304B can be non-porous silicon. In some embodiments, the sum of a width of first subregion 304A of cREO and a width of second subregion 304B of non-porous silicon may be defined as a periodicity related to a wavelength of an acoustic wave expected to travel through the epitaxial layer. According to such a combination of a first subregion and a second subregion, the second layer can facilitate localized strain on the additional layer grown or deposited. Such localized strain can improve the epitaxial growth of additional layers.

In the example of FIG. 3, the figure depicts cREO first subregion. In some embodiments, the cREO first subregion may be an island grown over substrate 102. The left diagram of schematic representation 300 depicts masking material portions 304A and 304B on the surface of the substrate layer 102 to define desired gaps for the growth of discrete regions of cREO first subregion 304A. For the purposes of this disclosure, discrete regions of cREO may also be referred to as cREO islands. In some embodiments, the discrete regions may be arranged in a specific manner as required to grow or deposit cREO regions/islands as per the requirements of a device. In some embodiments, the conductive layers include III-O materials like $In_2O_3$ or a rare earth nitride or a rare earth silicide. This is described in PCT Application No. PCT/US2017/022821, filed on Mar. 16, 2017 and U.S. Provisional Patent Application No. 62,398,416, filed on Sep. 22, 2016, which are hereby incorporated herein by reference in their respective entireties.

In the example shown in FIG. 4, the second layer includes a discrete region 405. The discrete region 405 may include a first subregion 404A and a second subregion 404B. The first subregion 404A can be crystalline rare earth oxide. The second subregion 404B can be porous silicon. The porous silicon can be a fully depleted porous region, where all of the free carriers have been depleted. This is described in U.S. patent application Ser. No. 16/257,707, filed Jan. 25, 2019, U.S. patent application Ser. No. 16/178,495, filed Nov. 1, 2018, U.S. Pat. No. 10,128,350, issued Nov. 13, 2018, U.S. Provisional Patent Application No. 62/398,416, filed Sep. 22, 2016, each of which is hereby incorporated herein by reference in its respective entirety.

In some embodiments, the sum of a width of first subregion 404A of cREO and a width of second subregion 404B of porous silicon may be defined as a periodicity related to a wavelength of an acoustic wave expected to travel through the epitaxial layer. According to such a combination of a first subregion and a second subregion, the second layer can facilitate localized strain on the additional layer grown or deposited. Such localized strain can improve the epitaxial growth of additional layers.

FIGS. 5-9 show examples of layered structures with various epitaxial layers over the second layer, according to an illustrative embodiment. It should be noted that layered structures 500, 600, 700, 800 or 900 or any feature of layered structures 500, 600, 700, 800 or 900 could be provided in any of the devices shown in FIGS. 1-4. For example, epitaxial layer 508 may be implemented in a layered structure 100 (FIG. 1).

Figure 5:
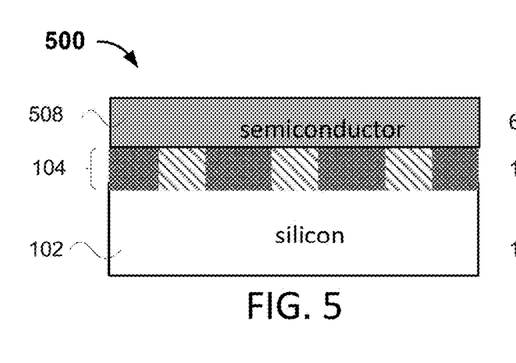
FIGS. 5-9 show examples of layered structures with various epitaxial layers over the second layer, according to an illustrative implementation.

In the example shown in FIG. 5, the layered structure 500 includes a semiconductor layer over the second layer 104. Semiconductor refers to any solid substance that has a conductivity between that of an insulator and that of most metals. An example semiconductor layer is composed of silicon. The semiconductor layer may include a single bulk layer, or multiple sub-layers. Specifically, a silicon semiconductor layer may include multiple porous regions. The multiple porous regions may have different densities and may be horizontally distributed. The porous region 104B of the discrete region 105 also can include periodic variation of porosity through depth of the second subregion 104B. In such a case, the porosity of the second subregion can be graded, and gradually increasing. The semiconductor layer 108 may comprise one or more of a III-nitride material, a III-V material, and a Group IV material. III-V materials include one or more species from Group III of the Periodic Table (such as B, Al, Ga, In, and Tl) and one or more species from Group V of the Periodic Table (such as N, P, As, Sb, and Bi). III-nitrides are III-V materials and include a species from Group III and nitrogen. Examples of III-nitride materials include GaN, $In_xAl_yGa_{1-x-y}N$ (0≤x, y≤1), and/or AlN. Examples of other III-V materials include one or more of GaAs, InP, InAs, InSb, InGaAs, GaAsP, InGaAsP, and the like.

If the semiconductor material is used in a filter and is epitaxial, then it lends itself to integration of additional semiconductor elements (not necessarily directly electrically connected to the filter) that may be grown above the filter. For example, a transistor (examples of which include a field effect transistor, a high-electron-mobility transistor, and a heterojunction bipolar transistor) may be grown over the filter, thus reducing the chip area required for a given system.

Figure 6:
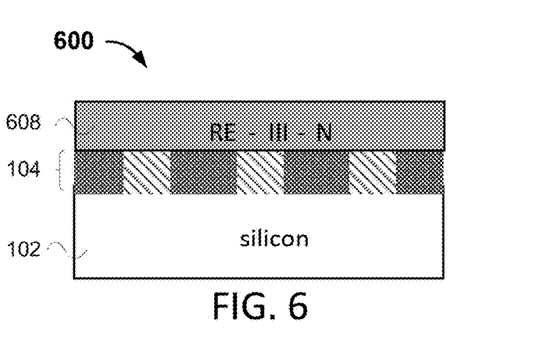

In the example shown in FIG. 6, the layered structure 600 includes a RE-III-N layer 608 over the second layer 104. In the RE-III-N layer, RE represents a rare earth element. III represents group III of the Periodic Table (such as B, Al, Ga, In, and Tl). N represents Nitrogen.

Figure 7:
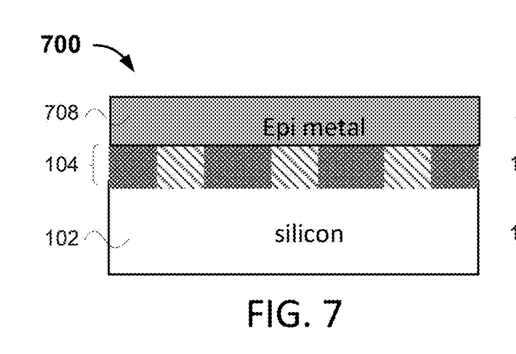

In the example shown in FIG. 7, the layered structure 700 includes an epitaxial metal layer 708 over the second layer 104. The second layer 104, including the crystalline REO region 104A is a template for the epitaxial metal layer 108, which may comprise one or more constituent epitaxial metal layers.

The epitaxial metal used could be a rare earth metal or a metal such as ruthenium or molybdenum, or other representative metals. Attributes to consider for selecting the metal element for the epitaxial metal layer 708 include resistivity, and also density, Young's modulus and refractive index which determine optical and acoustic properties of the layer.

A buried metal contact layer may be grown using epitaxial deposition of metal over a second layer. The epitaxial metal layer may be grown directly on the second layer and/or directly on a substrate layer. In some examples, an optional transitional layer may be between the epitaxial metal layer and the underlying second layer, and/or between the epitaxial metal layer and the underlying substrate. As well as the electrical advantages a buried contact layer would bring, there are often interactions between a metal and the overlying semiconductor that may be utilized. These interactions, such as in RF filters, are more useful when the interface between the metal and semiconductor (and any intervening interface) is high-quality with few defects. In addition, epitaxial metals may be made thinner than sputtered metals while preserving high-film quality. This is in part because epitaxial interfaces are higher quality, and as layers are thinned, the interfaces become a larger proportion of the overall material. Thus, while a thick film is less affected by poor quality interfaces and its properties are dominated by the bulk material properties, the properties of a thin-film are more dominated by the interfacial properties. Thus, high-quality interfaces are important when depositing thin-films.

In addition, an epitaxial metal layer may be used to modify the reflectivity of an epitaxial stack of layers. For devices where light is to be emitted from the top surface, light that is emitted towards the substrate is generally considered to be lost to the overall output power. In vertical cavity surface emitting lasers (VCSELs), for example, the back mirror has to have a reflectivity >99.8%. This is difficult to achieve solely through semiconductor materials. The spacing of the discrete regions in the second layer related to the wavelength of the acoustic wave, improves epitaxial growth of additional materials over the patterned template wafer, which results in higher quality of subsequent films and improves the reflectance of the acoustic waves through the epitaxial layer.

Figure 8:
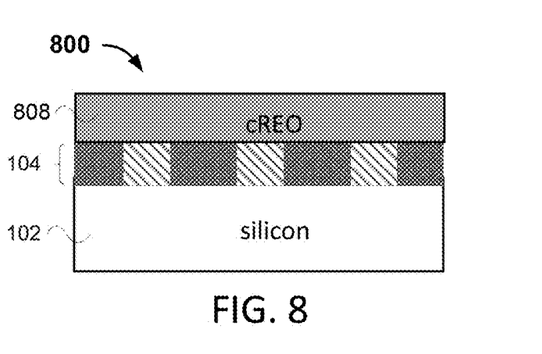

In the example shown in FIG. 8, the layered structure 800 includes a crystalline rare earth oxide layer 808 over the second layer 104. In some embodiments, the oxygen-to-metal ratio for the REO layer 808, ranges from 1 to 2.

A crystalline rare earth oxide (REO) epitaxial layer may be used as a template for epitaxial metal on semiconducting substrates such as silicon. For the purpose of metal epitaxy, crystalline REO is a superior material compared to YSZ. For a start, the interface between the crystalline REO and the second layer is set as part of the epitaxial process. With the appropriate choice of rare earth oxide, crystalline REO templates may be epitaxially grown that are 100% (or nearly 100%) cubic with no secondary phase. Other parameters and process characteristics of crystalline REO that are beneficial to the overall epitaxial stacks are an oxide-silicon interface that is free of any parasitic charge, a higher density than YSZ (8.6 to 6.1 g/cm3), and a 5× better thermal conductivity than YSZ. In addition to serving as a template for epitaxial metal growth, the crystalline REO layer may also prevent inter-diffusion between the epitaxial metal layer and any substrate below. This prevents the formation of, for example, unwanted metal silicides (where the substrate is silicon).

In one example, a crystalline REO layer may be epitaxially grown over a second layer, and additional processing may include a metal layer epitaxially grown over the crystalline REO layer. A semiconductor layer may be grown over the epitaxial metal layer. An REO layer is a layer that contains one or more rare earth (RE) species and oxygen. The rare earth species include Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy). Holmium (Ho), Erbium (Er), Thulium (Tm), Ytterbium (Yb), Luthium (Lu), Scandium (Sc) and Yttrium (Y).

REOs are known to exhibit fluorite-type structures. These structures exhibit morphology differences as a function of the atomic weight of the rare-earth cation present in the oxide, among any other factors.

On the other hand, oxides formed from heavier rare-earths (e.g., $RE_2O_3$, etc.), exhibit a distorted $CaF_2$-type crystal structure which includes anion vacancies due to an ionization state of RE<3+>. The crystal structure associated with rare-earth oxides of heavier rare earths is also known as "Bixbyite."

An illustrative example of a rare-earth oxide having the formula $RE_2O_3$, is $Er_2O_3$. The crystal structure of a unit cell of $Er_2O_3$ is an oxygen-vacancy-derived fluorite derivative (i.e., Bixbyite structure). REO dielectric layers may comprise an assemblage of these unit cells.

The number and position of the anion vacancies determines the crystal shape of the $RE_2O_3$ unit cell. The crystal shape of this cell may be engineered to provide a suitable match to the lattice-constant of the underlying semiconductor substrate. Oxygen vacancies along the body diagonal and/or the face diagonal lead to a C-type cubic structure. For example, two anion vacancies per fluorite unit cell causes the unit cell of $Er_2O_3$ to increase to nearly twice the unit cell size of Si. This, in turn, enables low-strain, single-phase $Er_2O_3$ to be epitaxially grown directly on a silicon substrate.

Furthermore, the number and position of the anion vacancies may be engineered to induce a desired strain (tensile or compressive) in the dielectric layer and/or overgrown layers. For example, in some embodiments, strain in the semiconductor layer is desired in order to affect carrier mobility.

Each fluorite unit cell has two oxygen vacancies, which lie along the body diagonal. The presence of these two oxygen vacancies causes the $Er_2O_3$ unit cell to double in size, thereby doubling its lattice-constant, which provides a suitable match to the lattice-constant of <100> silicon.

In some examples, oxygen vacancies lie at the ends of the face diagonal. In some other examples, oxygen vacancies are distributed between the ends of the face diagonal and the body diagonal.

Figure 9:
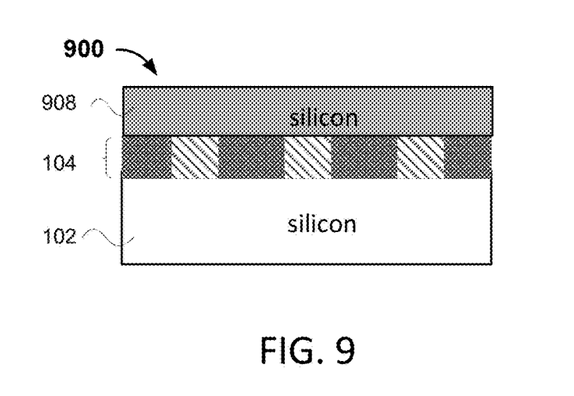

In the example shown in FIG. 9, the layered structure 900 includes a silicon layer 908 over the second layer 104. A silicon layer may exist in the substrate layer below the second layer and the epitaxial layer over the second layer. The porosity of the layers may vary from the substrate layer to the epitaxial layer over the second layer. The porous portion in the substrate 102 may be non-continuous, e.g., with non-continuous and non-overlapping porous portions 102 and 908. For example, the non-continuity of the porous portion may be extended to all three dimensions, e.g., different porous portions may be distributed in the substrate 102 vertically, or horizontally in two dimensions. For another example, different portions or regions (e.g., 102) of the porous portion may have different porosities.

Figure 10:
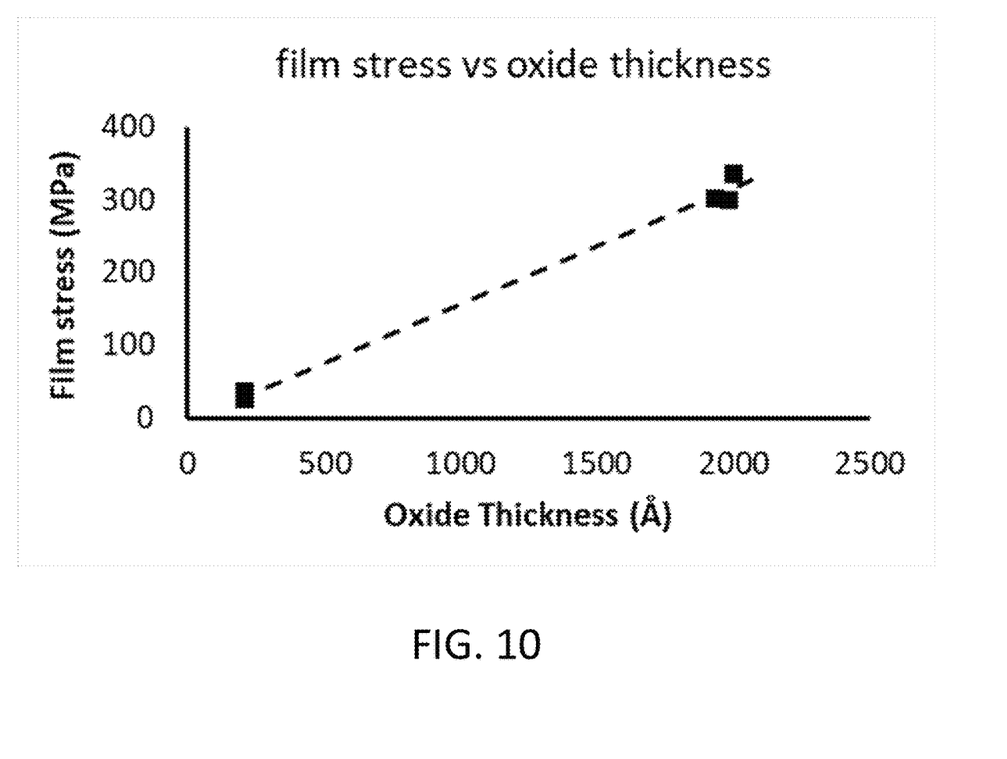
FIG. 10 is a graph showing film stress vs. oxide thickness for epitaxial cREO on silicon, according to an illustrative implementation.

FIG. 10 is a graph showing film stress vs. oxide thickness for epitaxial cREO on silicon. As the thickness of the oxide layer (e.g., cREO) increases, the layer exhibits increased stress. Here, the oxide thickness is adjusted to locally stress the subsequently-grown or deposited epitaxial layer.

Figure 11:
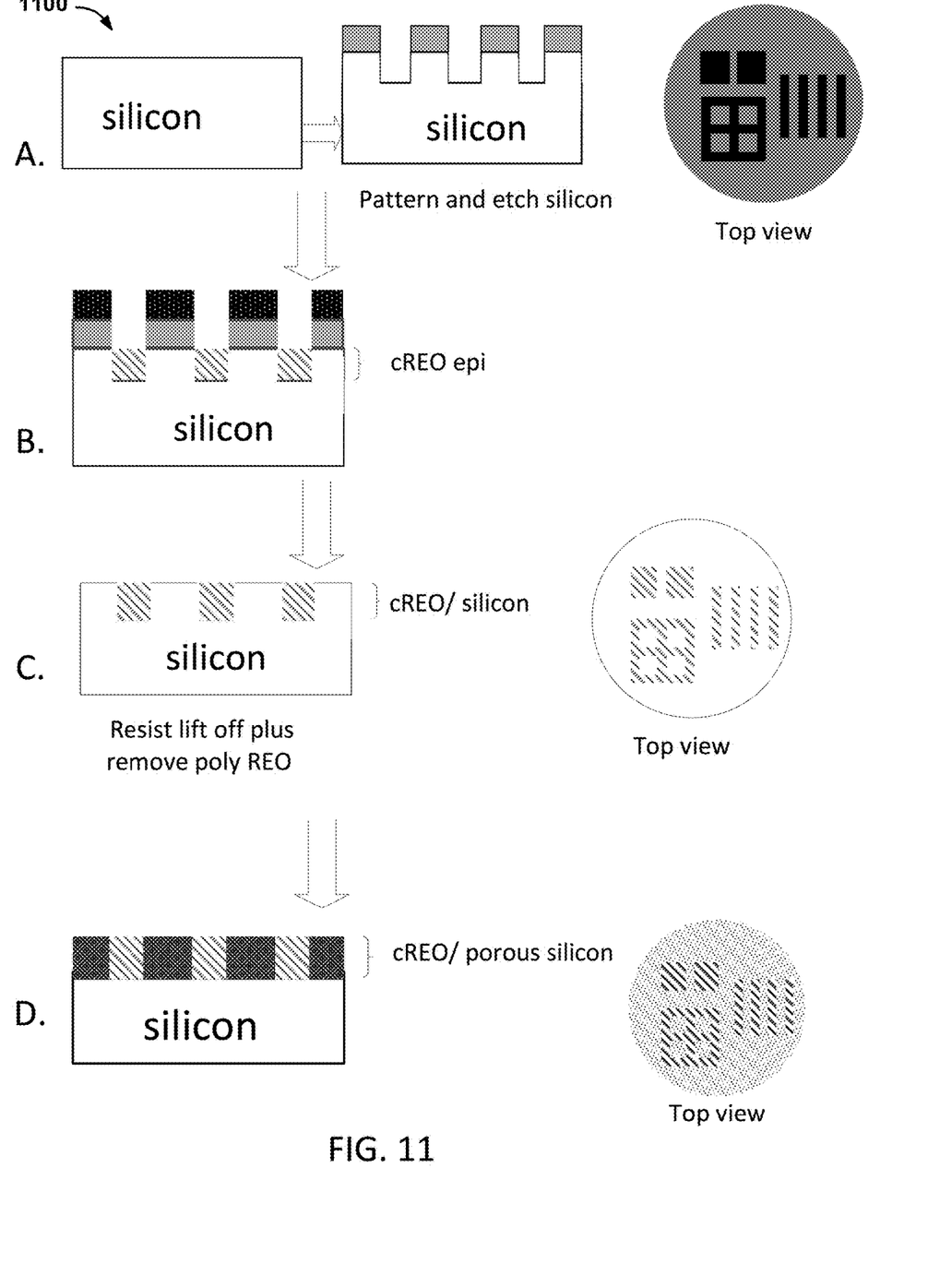
FIG. 11 depicts an illustrative method of forming a layered structure, according to an illustrative implementation.

FIG. 11 depicts an illustrative method of forming a layered structure, according to an illustrative embodiment. The process 1100 starts at A, where a silicon substrate is obtained. The silicon substrate is patterned and etched to form groves in the surface of the silicon substrate and form a second layer from the silicon substrate. The surface of the second layer may take a form similar to grids, rows, columns, dots, rings, or other irregular shapes, as shown in the top view at A. The second layer is prepared by etching the surface of the substrate layer. At B, a first material is epitaxially grown or deposited over the second layer. The material epitaxially grown or deposited into the groves of the second layer may be a crystalline rare earth oxide. At C, the layered structure is processed, by any suitable technique, for example chemical-mechanical polishing (CMP), to prepare the surface of the second layer for growing an epitaxial layer over the second layer. At D, the second subregion of the second layer can be further processed, by processing the second subregion of the second layer into a porous silicon.

Figure 12:
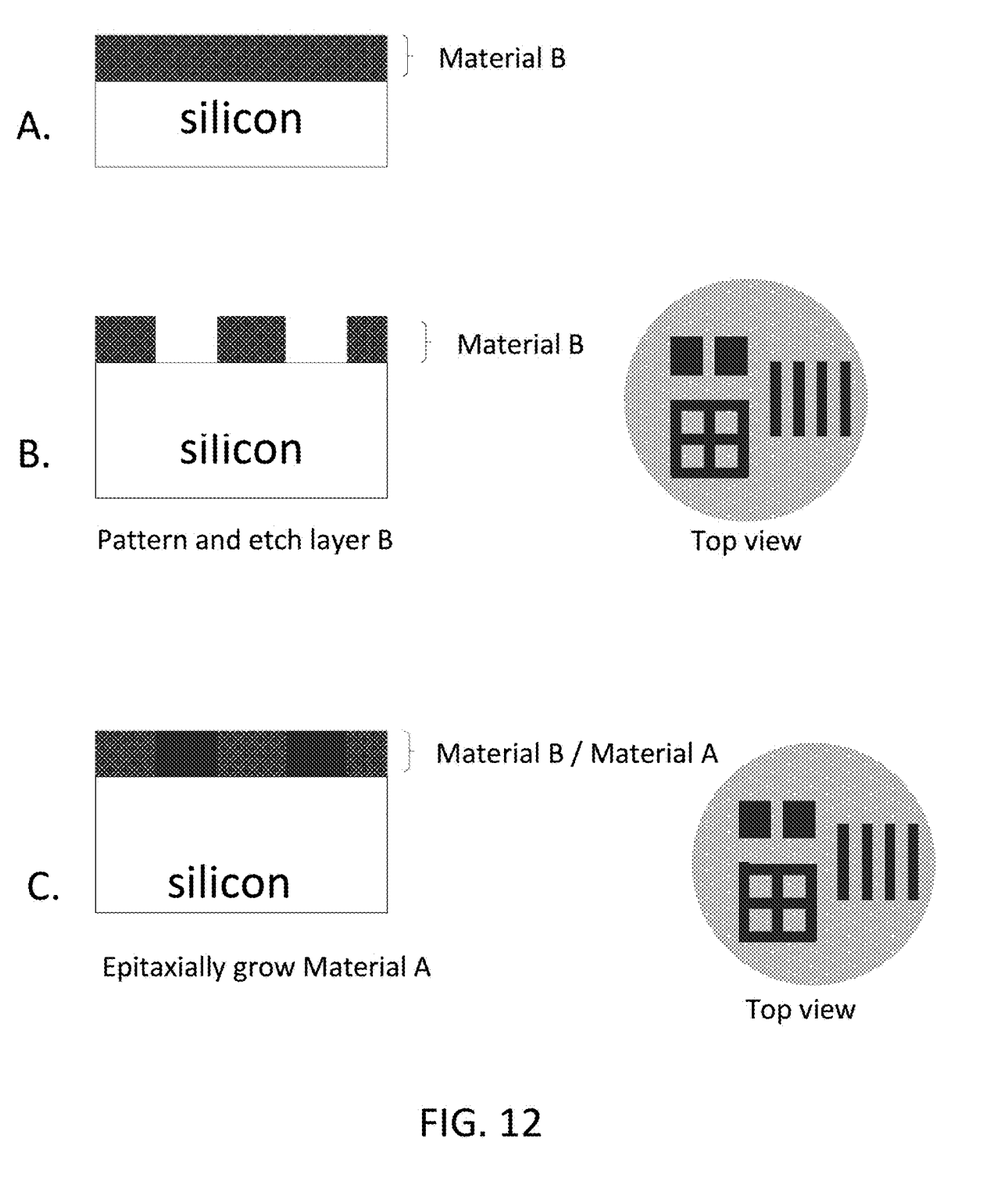
FIG. 12 depicts an illustrative method of forming a layered structure, according to an illustrative implementation.

FIG. 12 depicts an illustrative method of forming a layered structure, according to an illustrative embodiment. The process 1200 starts at A, where a silicon substrate includes a continuous layer of silicon, labelled "Material B", via silicon epitaxy, over the silicon substrate. At B, the continuous layer of silicon, over the silicon substrate, is patterned and etched to form groves in the surface of the continuous layer of silicon. The surface of the continuous layer of silicon may take a form similar to grids, rows, columns, dots, rings, or other irregular shapes, as shown in the top view at B. At C, a layer is epitaxially grown, via anodic etching of the silicon wafer, into the groves of the continuous layer of silicon. The layer epitaxially grown into the groves of the continuous layer is a porous silicon, labelled "Material A". Such method can form porous regions in the continuous layer of silicon, which can improve epitaxial growth of additional materials over the patterned template wafer.

Figure 13:
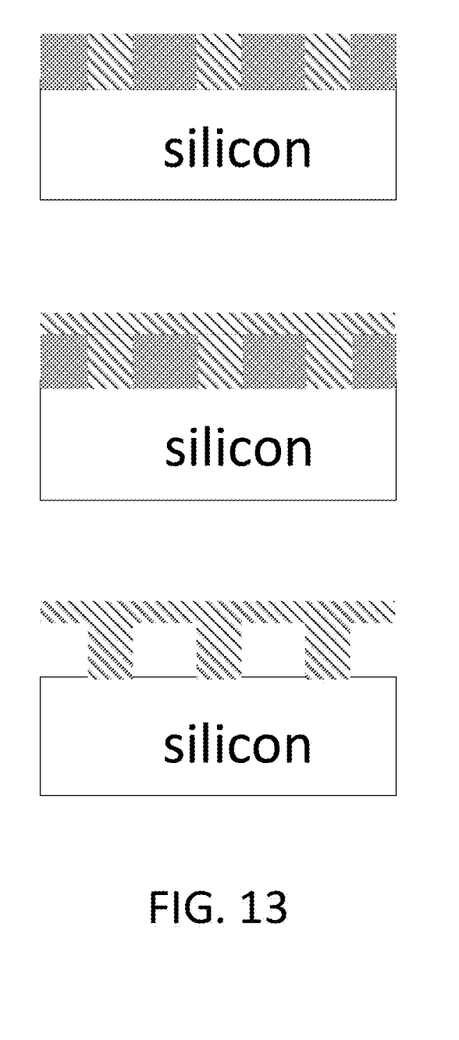
FIG. 13 shows examples of layered structures with various epitaxial layers over the second layer, according to an illustrative implementation.

FIG. 13 show examples of layered structures with various epitaxial layers over the second layer, according to an illustrative embodiment. Specifically, the examples in FIG. 13 include various examples of a second layer discussed above in FIG. 2-4 and various examples of an epitaxial layer over the second layer discussed above in FIG. 5-9.

Figure 14:
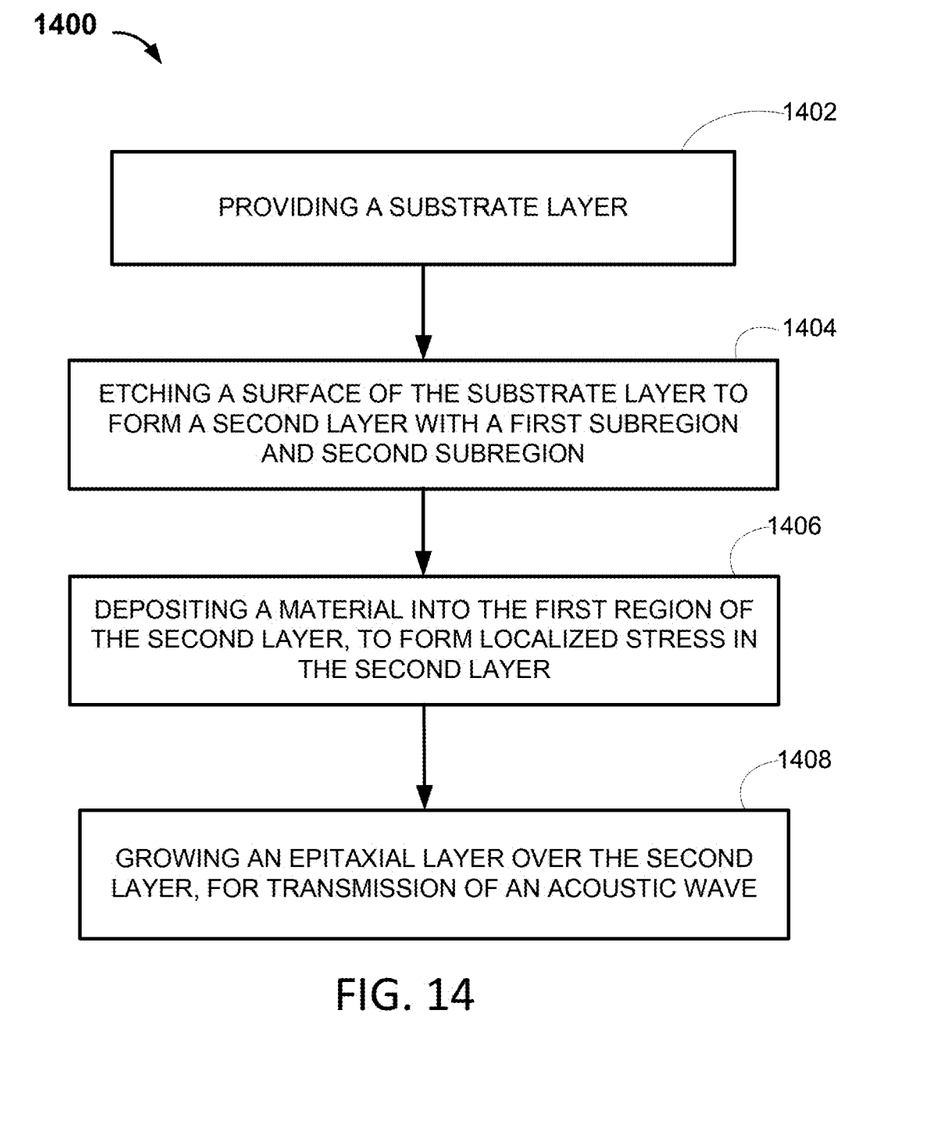
FIG. 14 is a flow diagram depicting a method for growing the layered structure shown in FIG. 1, according to an illustrative implementation.

FIG. 14 is a flow diagram charting a method for growing the layered structure shown in FIG. 1, according to an illustrative embodiment. The process starts at 1402, when a substrate 102 is obtained. At 1404, a second layer is prepared by etching the surface of the substrate layer. At 1406 a first material is epitaxially grown or deposited over the substrate layer, first subregion 104A. At 1408, an epitaxial layer 108 is epitaxially grown over the second layer 104.

At step 1402, substrate is provided. In some embodiments, a substrate layer, optionally a monolithic substrate layer, may be grown or otherwise formed in a particular orientation. In some embodiments, substrate includes a group IV element selected from a group of silicon (Si), germanium (Ge), silicon on insulator (SOI), and silicon carbide (SiC), wherein the substrate has a crystal orientation of either on-axis or with a miscut of up to 10 degrees, in one example.

Step 1404 includes etching a surface of the substrate layer to form a second layer over the substrate layer. In some embodiments, a second layer is formed with discrete regions, including a first subregion and a second subregion. For example, the top sublayer of the substrate is etched and can form a first subregion (e.g., a void) and a second subregion of an original sublayer.

Step 1406 includes growing a material into the first subregion of the second layer. For example, a cREO material is epitaxially deposited or grown into the first subregion. The first subregion, including the cREO material can locally strain the layered structure.

At 1408, an epitaxial layer (e.g., see epitaxial layer 108 in FIG. 1) is epitaxially grown over the second layer. By employing the localized stress of the second layer, the epitaxial layer grown over the second layer is improved.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" or "over" an underlying material or layer. This layer may comprise intermediate layers, such as transitional layers, necessary to ensure a suitable surface. For example, if a material is described to be "disposed on" or "over a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk germanium wafers, bulk silicon wafers, in which a wafer comprises a homogeneous thickness of single-crystal silicon or germanium; composite wafers, such as a silicon-on-insulator wafer that comprises a layer of silicon that is disposed on a layer of silicon dioxide that is disposed on a bulk silicon handle wafer; or the porous germanium, germanium over oxide and silicon, germanium over silicon, patterned germanium, germanium tin over germanium, and/or the like; or any other material that serves as base layer upon which, or in which, devices are formed. Examples of such other materials that are suitable, as a function of the application, for use as substrate layers and bulk substrates include, without limitation, alumina, gallium-arsenide, indium-phosphide, silica, silicon dioxide, borosilicate glass, pyrex, and sapphire. A substrate may have a single bulk wafer, or multiple sub-layers. Specifically, a substrate (e.g., silicon, germanium, etc.) may include multiple porous portions. The multiple porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple porous portions. The multiple porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

As used herein and in the claims which follow, the construction "one of A and B" shall mean "A or B."

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

The invention claimed is:

1. A layered structure for transmission of a wave, the layered structure comprising:
    a substrate layer;
    a second layer over the substrate layer, wherein the second layer comprises a plurality of discrete portions adjacent to each other, each discrete portion of the plurality of discrete portions comprising a first subregion and a second subregion; and
    an epitaxial layer, grown over the second layer, for transmission of the wave in the epitaxial layer,
    wherein a periodicity ($\lambda$) of the plurality of discrete portions is approximately equal to a sum of a width ($d_A$) of the first subregion and a width ($d_B$) of the second subregion,
    wherein the periodicity ($\lambda$) is based on a wavelength of the wave to be transmitted through the epitaxial layer, and
    wherein the first subregion comprises a first material and the second subregion comprises a second material to locally stress the epitaxial layer.

2. The layered structure of claim 1, wherein the first subregion is selected from the group comprising non-porous silicon, porous silicon, crystalline rare earth oxides (cREO), and combinations thereof; and
    wherein the second subregion is selected from the group comprising non-porous silicon, porous silicon, crystalline rare earth oxides (cREO), and combinations thereof.

3. The layered structure of claim 1, wherein the epitaxial layer is one of a semiconductor layer, a RE-III-N layer, an epitaxial metal layer, a crystalline rare earth oxide (cREO) layer, and a silicon layer.

4. The layered structure of claim 1, wherein the substrate includes one or more group IV elements selected from the group comprising silicon (Si), germanium (Ge), silicon-on-insulator (SOI), and SiGe.

5. The layered structure of claim 1, further comprising electrodes disposed over the epitaxial layer, wherein the electrodes are distributed based on the periodicity ($\lambda$) of the second layer.

6. A method of forming a layered structure for transmission of a wave, the method comprising:
    providing a substrate layer;
    etching a surface of the substrate layer to form a second layer over the substrate layer, the second layer comprising a plurality of discrete portions adjacent to each other, each discrete portion of the plurality of discrete portions comprising a first subregion and a second subregion, wherein the first subregion forms a void;
    depositing a material into the void of the first subregion of the second layer, to form localized stress in the second layer; and
    growing an epitaxial layer over the second layer, for transmission of the wave,
    wherein a periodicity ($\lambda$) of the plurality of discrete portions is matched to a sum of a width ($d_A$) of the first subregion and a width ($d_B$) of the second subregion,
    wherein the periodicity ($\lambda$) is based on a wavelength of the wave to be transmitted through the epitaxial layer, and
    wherein the first subregion comprises a first material and the second subregion comprises a second material to locally stress the epitaxial layer.

7. The method of claim 6, further comprising:
    processing the second subregion of the second layer with anodic etching to make the second subregion porous.

8. The method of claim 6, wherein depositing the material into the void of the first subregion of the second layer comprises growing a material selected from the group comprising non-porous silicon, porous silicon, crystalline rare earth oxides (cREO), and combinations thereof.

9. The method of claim 6, wherein growing the epitaxial layer over the second layer comprises growing one of a semiconductor layer, a RE-III-N layer, an epitaxial metal layer, a crystalline rare earth oxide (cREO) layer, and a silicon layer.

10. A method of forming a layered structure for transmission of a wave, the method comprising:
    providing a substrate layer;

depositing a second layer over the substrate layer, the second layer comprising a plurality of discrete portion comprising second subregions adjacent to each other with voids between them;

depositing a material into the voids to form first subregions of the second layer, to provide localized stress in the second layer; and growing an epitaxial layer over the second layer, for transmission of the wave, wherein a periodicity ($\lambda$) of the plurality of discrete portions is matched to a sum of a width ($d_A$) of the first subregion and a width ($d_B$) of the second subregion, wherein the periodicity ($\lambda$) is based on a wavelength of the wave to be transmitted through the epitaxial layer, and wherein the first subregions comprise a first material and the second subregions comprise a second material to locally stress the epitaxial layer.

11. The method of claim 10, further comprising:
processing the first subregion of the second layer with anodic etching to make the first subregion porous.

12. The method of claim 10, further comprising:
processing the second subregion of the second layer with anodic etching to make the second subregion porous.

13. The method of claim 10, wherein depositing the material into the voids to form first subregions of the second layer comprises growing a material selected from the group comprising non-porous silicon, porous silicon, crystalline rare earth oxides (cREO), and combinations thereof.

14. The method of claim 10, wherein growing the epitaxial layer over the second layer comprises growing one of a semiconductor layer, a RE-III-N layer, an epitaxial metal layer, a crystalline rare earth oxide (cREO) layer, and a silicon layer.

15. The layered structure of claim 1, wherein the epitaxial layer is a locally stressed epitaxial layer configured to increase transmission of the wave.

16. The layered structure of claim 1, wherein the wave is an acoustic wave.

17. The layered structure of claim 1, wherein the wave is transmitted in a major plane of the epitaxial layer.

* * * * *